US011297751B2

(12) United States Patent
Kuroda (10) Patent No.: US 11,297,751 B2
(45) Date of Patent: Apr. 5, 2022

(54) COMPONENT MOUNTING LINE (71) Applicant: FUJI CORPORATION, Chiryu (JP)

(72) Inventor: Hideya Kuroda, Toyota (JP)

(73) Assignee: FUJI CORPORATION, Chiryu (JP)

( * ) Notice: Subject to any disclaimer, the term of this patent is extended or adjusted under 35 U.S.C. 154(b) by 70 days.

(21) Appl. No.: 16/756,918

(22) PCT Filed: Nov. 6, 2017

(86) PCT No.: PCT/JP2017/039928
§ 371 (c)(1),
(2) Date: Apr. 17, 2020

(87) PCT Pub. No.: WO2019/087392
PCT Pub. Date: May 9, 2019

(65) Prior Publication Data
US 2021/0195817 A1 Jun. 24, 2021

(51) Int. Cl.
*B23P 19/00* (2006.01)
*H05K 13/04* (2006.01)
*H05K 13/08* (2006.01)
*H05K 13/00* (2006.01)
*H05K 13/02* (2006.01)

(52) U.S. Cl.
CPC ..... *H05K 13/0495* (2013.01); *H05K 13/0069* (2013.01); *H05K 13/021* (2013.01); *H05K 13/0857* (2018.08)

(58) Field of Classification Search
CPC ............. H05K 13/0069; H05K 13/021; H05K 13/0495; H05K 13/0857; H05K 13/0888
See application file for complete search history.

(56) References Cited

U.S. PATENT DOCUMENTS 10,820,459 B2 * 10/2020 Kondo ............... H05K 13/0452
10,871,760 B2 * 12/2020 Furuichi ............ H05K 13/0815
11,039,558 B2 *  6/2021 Yamakage ......... H05K 13/0404
(Continued)

FOREIGN PATENT DOCUMENTS

WO    WO 2016/035145 A1    3/2016

OTHER PUBLICATIONS

International Search Report dated Jan. 30, 2018 in PCT/JP2017/039928 filed Nov. 6, 2017.

*Primary Examiner* — Paul D Kim
(74) *Attorney, Agent, or Firm* — Oblon, McClelland, Maier & Neustadt, L.L.P.

(57) ABSTRACT

An automatic exchanging device for moving in an arrangement direction of multiple component mounting machines alongside the front face of a component mounting line to set feeders to and/or remove feeders from a feeder setting base of each component mounting machine, and a control device for controlling the movement of the automatic exchanging device. The control device monitors the operational states of the multiple component mounting machines and, when an error requiring the work of the operator occurs in any one of the component mounting machines, sets a predetermined range including the component mounting machine to a movement prohibited area of the automatic exchanging device to move the automatic exchanging device out of the movement prohibited area until it is determined that the work is completed.

10 Claims, 7 Drawing Sheets

(56) References Cited

U.S. PATENT DOCUMENTS

| | | | | |
|---|---|---|---|---|
| 2016/0037693 | A1* | 2/2016 | Kurashina | H05K 13/085 |
| | | | | 29/739 |
| 2016/0360657 | A1* | 12/2016 | Oyama | H05K 13/0434 |
| 2019/0053408 | A1* | 2/2019 | Kondo | H05K 13/0417 |
| 2019/0274238 | A1* | 9/2019 | Sugiyama | G06T 7/70 |
| 2020/0037480 | A1* | 1/2020 | Hirayama | H05K 13/0495 |
| 2020/0100410 | A1* | 3/2020 | Ushii | H05K 13/086 |

* cited by examiner

COMPONENT MOUNTING LINE

TECHNICAL FIELD

The present specification discloses a technique related to a component mounting line having an automatic exchanging device for automatically exchanging (i.e., setting and/or removing) feeders with feeder setting bases of multiple component mounting machines arranged along a conveyance path of a circuit board.

BACKGROUND ART

Recently, as described in Patent Literature 1 (International Publication WO2016/035145), an automatic exchanging device (exchanging robot) is installed in a movable manner in a moving lane provided alongside an arrangement of multiple component mounting machines constituting a component mounting line, wherein the automatic exchanging device is moved to the front of a component mounting machine at which an automatic exchange request has been generated and automatically exchanges a feeder with the feeder setting base of the component mounting machine.

In general, when an error occurs in one of the component mounting machines and production in the component mounting machine is stopped during operation of the component mounting line, an operator performs an inspection, adjustment, or the like of the component mounting machine and restarts production in the component mounting machine.

PATENT LITERATURE

Patent Literature 1: International Publication WO2016/035145

BRIEF SUMMARY

Technical Problem

If an automatic exchanging device is in front of or near a component mounting machine in which an error has occurred requiring work by an operator, it is cumbersome because the automatic exchanging device may interfere with the operator's work on the component mounting machine and it may become necessary to move the automatic exchanging device.

Further, even if an error occurs in one of the component mounting machines and production in the component mounting machine is stopped during operation of the component mounting line, since other component mounting machines continue production, an automatic exchange request of a feeder may occur in one of the component mounting machines continuing production. In such a case, even if the automatic exchanging device is positioned in a range that does not interfere with the operator's work on a component mounting machine when an error occurs in any of the component mounting machines, if the automatic exchanging device moves to the front of a component mounting machine in which an automatic exchange request is generated before the operator's work is completed, the automatic exchanging device may move into or pass a range that interferes with the operator's work.

Solution to Problem

In order to solve the above-mentioned problems, a component mounting line is provided, in which multiple component mounting machines are arranged along a conveyance path of a circuit board and components supplied from a feeder setting base of each component mounting machine are mounted on the circuit board by the multiple component mounting machines, the component mounting line comprising: an automatic exchanging device configured to move alongside a front face of the component mounting line in the arrangement direction of the multiple component mounting machines to set and/or remove feeders of the feeder setting base of each component mounting machine, and a control device configured to control movement of the automatic exchanging device, wherein the control device monitors the operational state of the multiple component mounting machines, and when an error requiring an operator's work occurs in any of the component mounting machines, the control device sets a predetermined range including the component mounting machine as a movement prohibited area of the automatic exchanging device, and causes the automatic exchanging device move outside of the movement prohibited area until completion of the work is determined.

In this manner, when an error requiring the work of an operator occurs in any of the multiple component mounting machines constituting the component mounting line, a predetermined range including the component mounting machine is set to the movement prohibited area of the automatic exchanging device until it is determined that the work is completed and the automatic exchanging device is moved outside of the movement prohibited area, thereby preventing the automatic exchanging device from becoming an obstacle when the operator performs work on the component mounting machine in which the error has occurred, and the work on the component mounting machine in which the error has occurred can be efficiently performed.

In this case, the movement prohibited area of the automatic exchanging device need only include a work area necessary for the operator to perform the work on the component mounting machine in which the error requiring the operator's work has occurred.

Further, a monitoring unit for monitoring whether a person or an object has intruded into a monitoring area around the automatic exchanging device may be provided in the automatic exchanging device, and when the monitoring unit detects intrusion of a person or an object into the monitoring area, the power supply to the driving system of the automatic exchanging device may be shut off and the automatic exchanging device may be stopped in an emergency. In this case, the movement prohibited area of the automatic exchanging device need only be set to at least the portion of the monitoring area overlapping the work area, the monitoring area being of the monitoring unit and moving together with the automatic exchange device. By doing so, since the movement prohibited area of the automatic exchanging device includes not only the work area but also an area in which at least a portion of the monitoring area of the monitoring device overlaps with the work area, it is possible to prevent beforehand an operator working in the work area of the component mounting machine in which an error has occurred from entering the monitoring area of the monitoring unit, and it is possible to prevent the automatic exchanging device from an emergency stop due to shutting off of the power supply to the driving system of the automatic exchanging device while the operator is working.

DESCRIPTION OF EMBODIMENTS

Hereinafter, an embodiment will be described. First, a configuration of component mounting line 10 will be described with reference to FIGS. 1 to 4. Component mounting line 10 is configured by arranging multiple component mounting machines 12 in a row along the conveyance direction (i.e., the X-direction) of circuit board 11, and a solder printing machine (not shown) for printing solder on circuit board 11, feeder storage device 19 for storing cassette-type feeders 14, and the like are installed on the side of component mounting line 10 to which boards are loaded.

Figure 1:
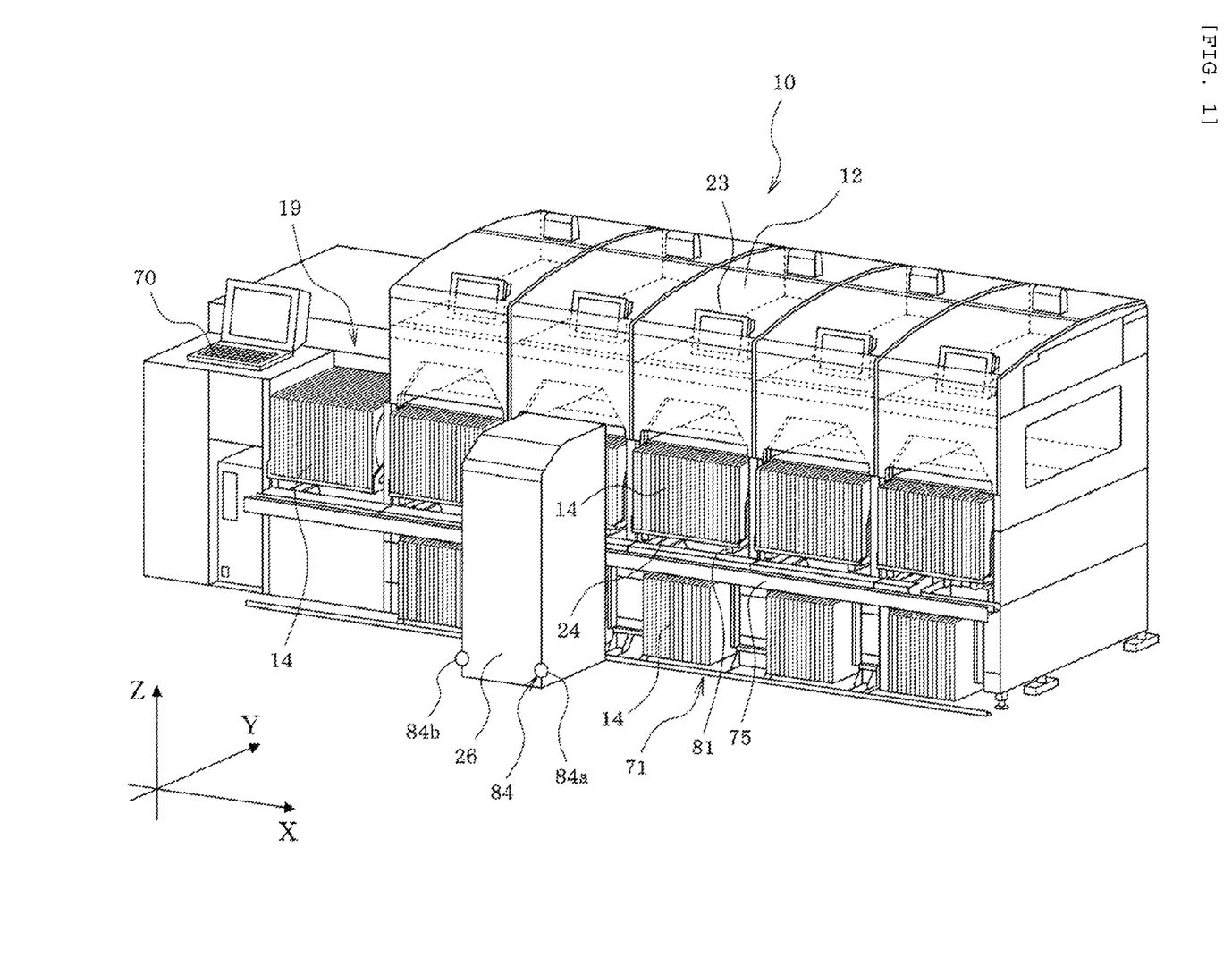
FIG. 1 is a perspective view showing a configuration of the entire component mounting line of an embodiment.
Figure 2:
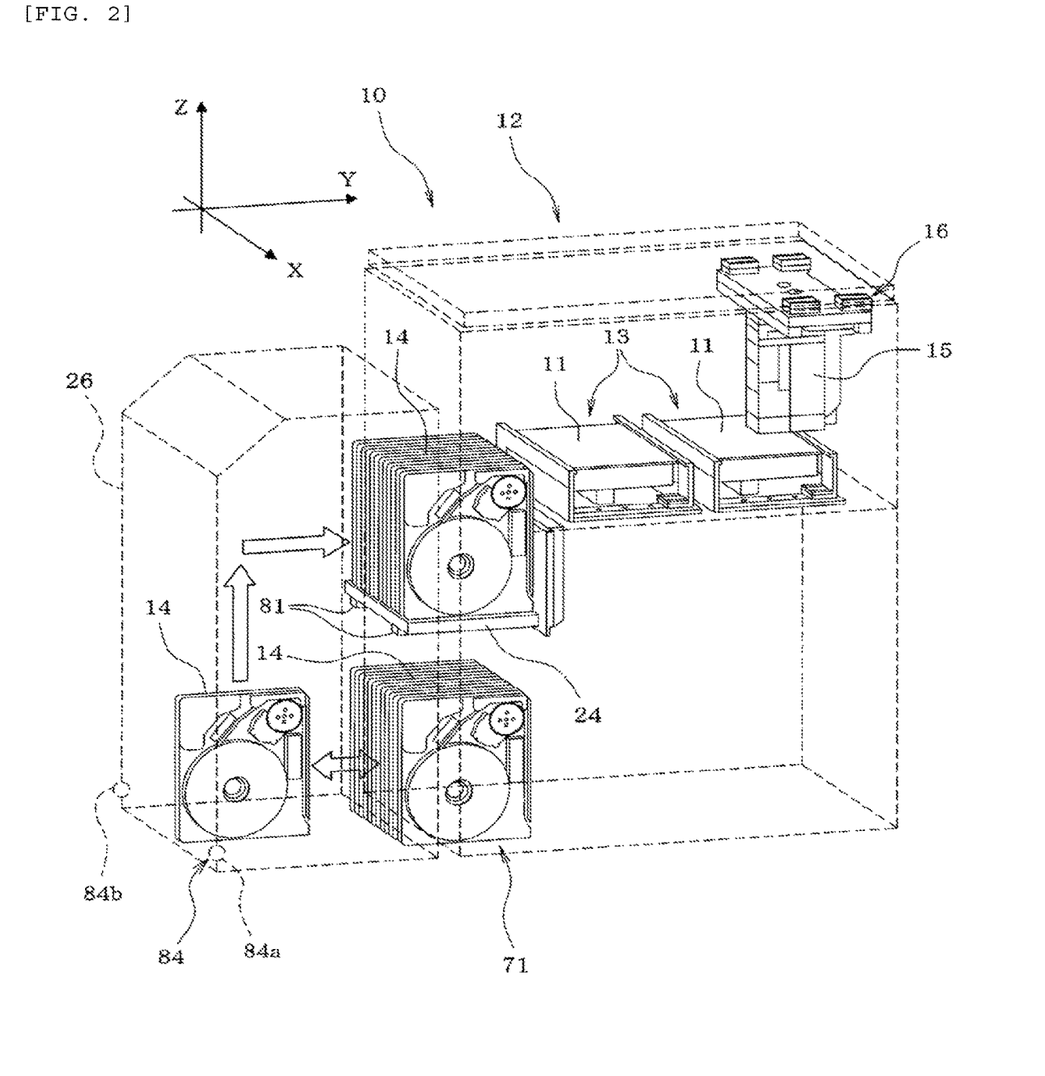
FIG. 2 is a perspective view schematically showing a configuration of an automatic exchanging device and a component mounting machine.

As shown in FIG. 2, each component mounting machine 12 is provided with two conveyors 13 for conveying circuit board 11, feeder setting base 24 (see FIG. 1) for exchangeably setting multiple cassette-type feeders 14, mounting head 15 for holding suction nozzles (not shown) for picking up components supplied from cassette-type feeders 14 set on feeder setting base 24 and mounting the components on circuit board 11, head moving device 16 for moving mounting head 15 in the XY-direction (i.e., left, right, forward, and rearward directions), component imaging camera 17 (see FIG. 3) for imaging the components picked up by the suction nozzles from below, and the like. Mark imaging camera 18 (see FIG. 3) for imaging a reference mark (not shown) of circuit board 11 is attached to head moving device 16 so as to move integrally with mounting head 15 in the XY-direction.

Figure 3:
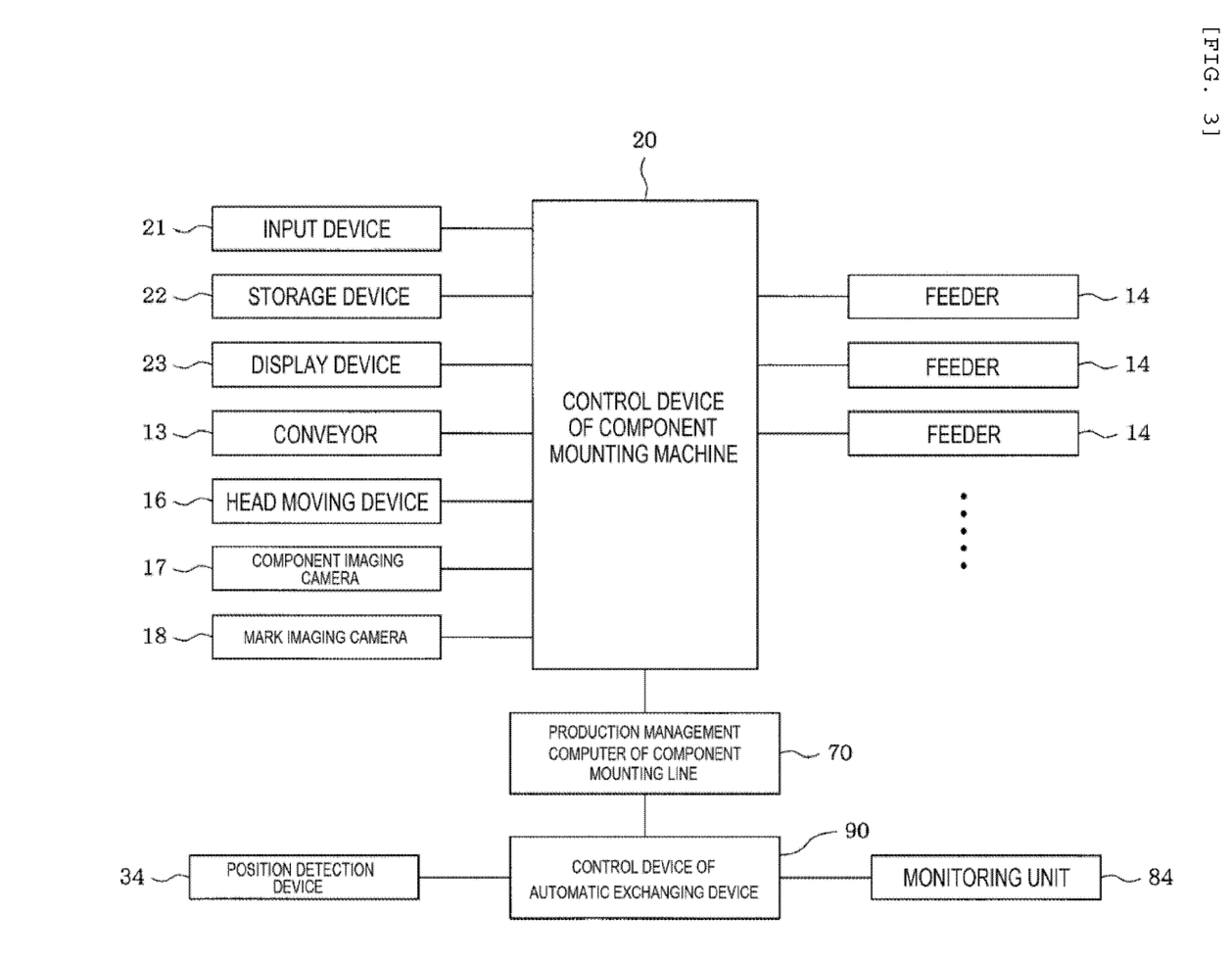
FIG. 3 is a block diagram schematically showing a configuration of a control system of the component mounting line having an automatic exchanging device.

In addition, as shown in FIG. 3, input device 21 such as a keyboard, a mouse, or a touch panel, storage device 22 such as a hard disk, RAM, or ROM for storing various programs for controlling, various data, and the like, display device 23 such as a liquid crystal display, a CRT, or the like are connected to control device 20 of component mounting machine 12. Control device 20 of each component mounting machine 12 is connected to production management computer 70, which manages production of the entire component mounting line 10 via a network.

Each component mounting machine 12 of component mounting line 10 conveys circuit board 11 conveyed from component mounting machine 12 on the upstream side to a predetermined position with conveyor 13, clamps and positions circuit board 11 with a clamping mechanism (not shown), images the reference mark of circuit board 11 with mark imaging camera 18, recognizes the position of the reference mark (i.e., a reference position of circuit board 11) and moves the component supplied from feeder 14 from the suction nozzle of mounting head 15 to an imaging position, moves the component from the suction position to the imaging position, images the component from below with component imaging camera 17, determines the suction position shift amount of the component, moves mounting head 15 to correct the suction position shift amount, and then mounts the component on circuit board 11, which is on conveyor 13, to produce the component mounting board.

As shown in FIG. 1, automatic exchanging device 26 for setting and/or removing feeder 14 to and from feeder setting base 24 of each component mounting machine 12 (hereinafter referred to as "automatic exchange") is installed on the front face side of component mounting line 10. Below feeder setting base 24 of each component mounting machine 12, stock section 71 for accommodating multiple feeders 14 to be set in feeder setting base 24 is provided. When an automatic exchange request of any of multiple component mounting machines 12 constituting component mounting line 10 is generated, automatic exchanging device 26 moves to component mounting machine 12 in which the automatic exchange request of feeder 14 was generated, takes out feeder 14 to be exchanged from feeder setting base 24 of component mounting machine 12 in question and collects it in stock section 71, and then takes out the necessary feeder 14 from stock section 71 and sets it in feeder setting base 24. Incidentally, depending on the automatic exchange request, there are cases in which automatic exchanging device 26 performs only the operation of collecting feeder 14 taken out from feeder setting base 24 in stock section 71 or, in reverse, there are cases in which automatic exchanging device 26 performs only the operation of setting feeder 14 taken out from stock section 71 to an empty slot of feeder setting base 24.

On the front face side of component mounting line 10, guide rail 75 for moving automatic exchanging device 26 in the X-direction alongside the arrangement of component mounting machines 12 is provided so as to extend in the X-direction over the entire component mounting line 10. The side of guide rail 75 that is on the board loading side of mounting line 10 extends to feeder storage device 19, enabling automatic exchanging device 26 to move to the front of feeder storage device 19 so that automatic exchanging device 26 can take out feeders 14 needed for automatic exchanging from feeder storage device 19 and return used feeders 14 into feeder storage device 19.

Automatic exchanging device 26 has a position detection device 34 (see FIG. 3) for detecting the position of automatic exchanging device 26 with respect to component mounting line 10. When an automatic exchange request is generated in any one of component mounting machines 12, control device 90 of automatic exchanging device 26, while detecting the position of automatic exchanging device 26 based on the detection signal of position detection device 34, moves automatic exchanging device 26 to component mounting machine 12 in which the automatic exchange request was generated, and controls the automatic exchange of feeder 14.

Although not shown in any of the drawings, in addition to automatic exchange of feeder 14, automatic exchanging device 26 can also automatically exchange cassette-type nozzle exchange units accommodating suction nozzles for exchanging, cassette-type calibration component supply units supplying calibration components, and the like with feeder setting base 24.

Production management computer 70 also functions as a control device for controlling the movement of automatic exchanging device 26 in conjunction with control device 90 of automatic exchanging device 26 and monitors whether an automatic exchange request has been generated in any of multiple component mounting machines 12 constituting component mounting line 10 during production, and when an automatic exchange request is generated in any of component mounting machines 12, the information is transmitted to control device 90 of automatic exchanging device 26 to cause automatic exchanging device 26 to move to the front of component mounting machine 12 in which the automatic exchange request was generated. Alternatively, control device 90 of automatic exchanging device 26 may be made to acquire information of component mounting machine 12 in which an automatic exchange request has been generated directly from component mounting machine 12 in question via the network, and automatic exchanging device 26 may then move to the front of component mounting machine 12 in question.

Further, automatic exchanging device 26 is provided with monitoring unit 84 for monitoring whether a person or an object has intruded into monitoring area 83 around automatic exchanging device 26. Monitoring unit 84 is configured by attaching, for example, two reflective safety sensors 84a, 84b (e.g., safety laser scanners) to both the left and right sides (both the front and rear sides in the moving direction) of the lower portion of the front face of automatic exchanging device 26. Monitoring area 83 of monitoring unit 84 is an area in which, when a person or an object intrudes into the area, in order to avoid collision between a person or an object and automatic exchanging device 26, a power supply which is a power supply to the drive system of automatic exchanging device 26 is shut off and automatic exchanging device 26 is stopped in an emergency. The size of monitoring area 83 can be arbitrarily changed by the user. When monitoring unit 84 detects the intrusion of a person or an object into monitoring area 83, the power supply to automatic exchanging device 26 is shut off, but the control power supply, which is the power supply to the control system of monitoring unit 84 and automatic exchanging device 26, is maintained even during the shutdown of the power supply, and monitoring unit 84 monitors the presence or absence of an intrusion of a person or an object into monitoring area 83, and when a person or an object intruding into monitoring area 83 comes out of monitoring area 83, the power supply to automatic exchanging device 26 is immediately restored to restart movement control of automatic exchanging device 26. Incidentally, at the time of evacuating automatic exchanging device 26, which will be described later, the condition for returning the power supply to automatic exchanging device 26 from the shutoff state is different from the normal power supply shutoff state.

When an error occurs in any one of component mounting machines 12 during operation of component mounting line 10 and production in component mounting machine 12 stops, it is necessary for the operator to restart production in component mounting machine 12 by performing operations such as an inspection, adjustment, or the like of component mounting machine 12. At this time, if automatic exchanging device 26 is in front of or near component mounting machine 12 in which an error has occurred, it is cumbersome because the automatic exchanging device 26 may interfere with the operator's work on component mounting machine 12 and it may become necessary to move automatic exchanging device 26.

Further, even if an error occurs in one of component mounting machines 12 and production in component mounting machine 12 is stopped during operation of component mounting line 10, since other component mounting machines 12 continue production, an automatic exchange request of feeder 14 may occur in one of component mounting machines 12 that continues production. In such a case, even if automatic exchanging device 26 is positioned in a range that does not interfere with the operator's work on component mounting machine 12 at the time when an error occurs in any of component mounting machines 12, if automatic exchanging device 26 moves to the front of component mounting machine 12 in which an automatic exchange request is generated before the operator's work is completed, automatic exchanging device 26 may move into or pass a range that interferes with the operator's work.

Figure 4:
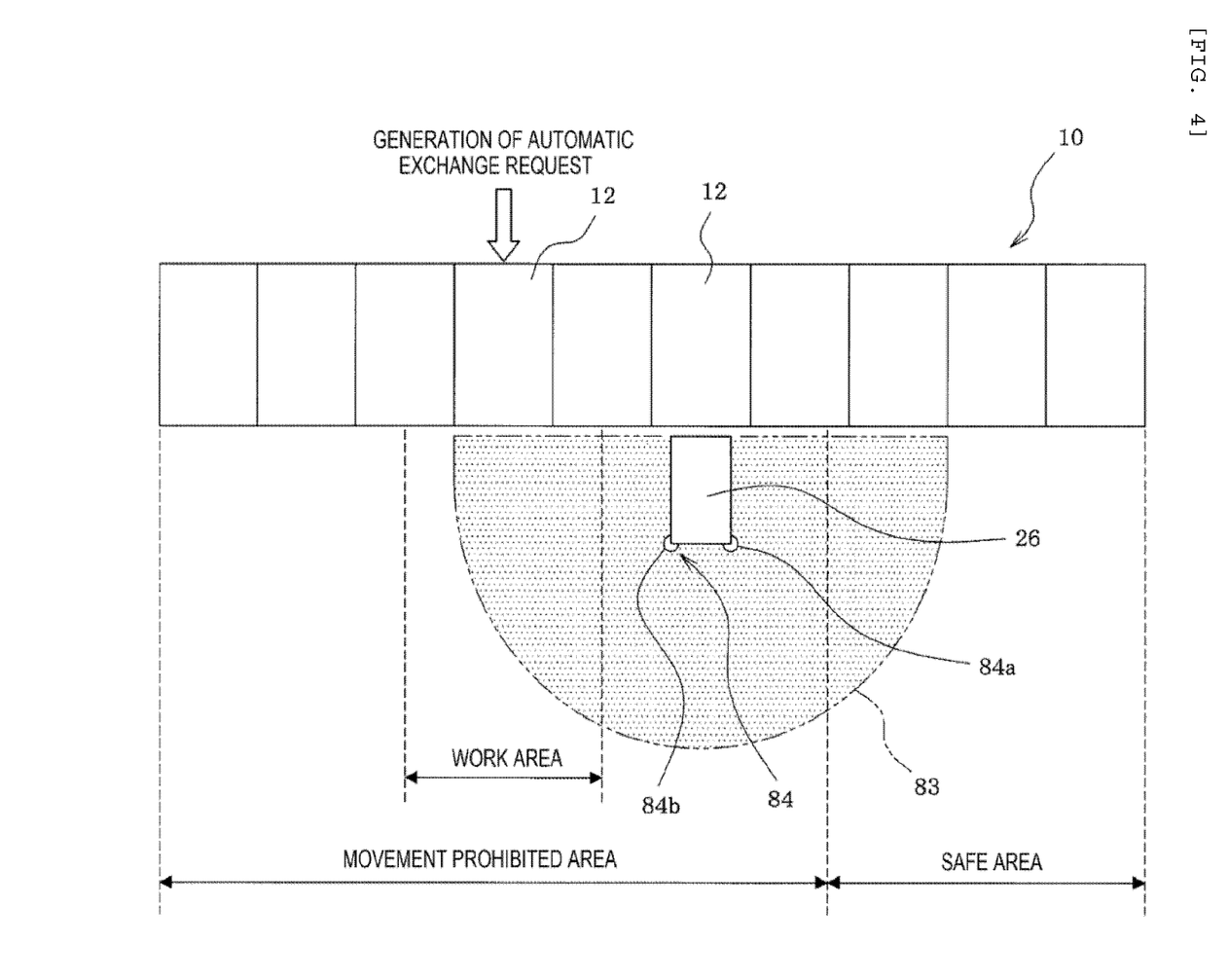
FIG. 4 is a plan view of the component mounting line showing a first example of a positional relationship among the position of a component mounting machine in which an error has occurred, a work area, a monitoring area, a movement prohibited area, and a safe area.
Figure 5:
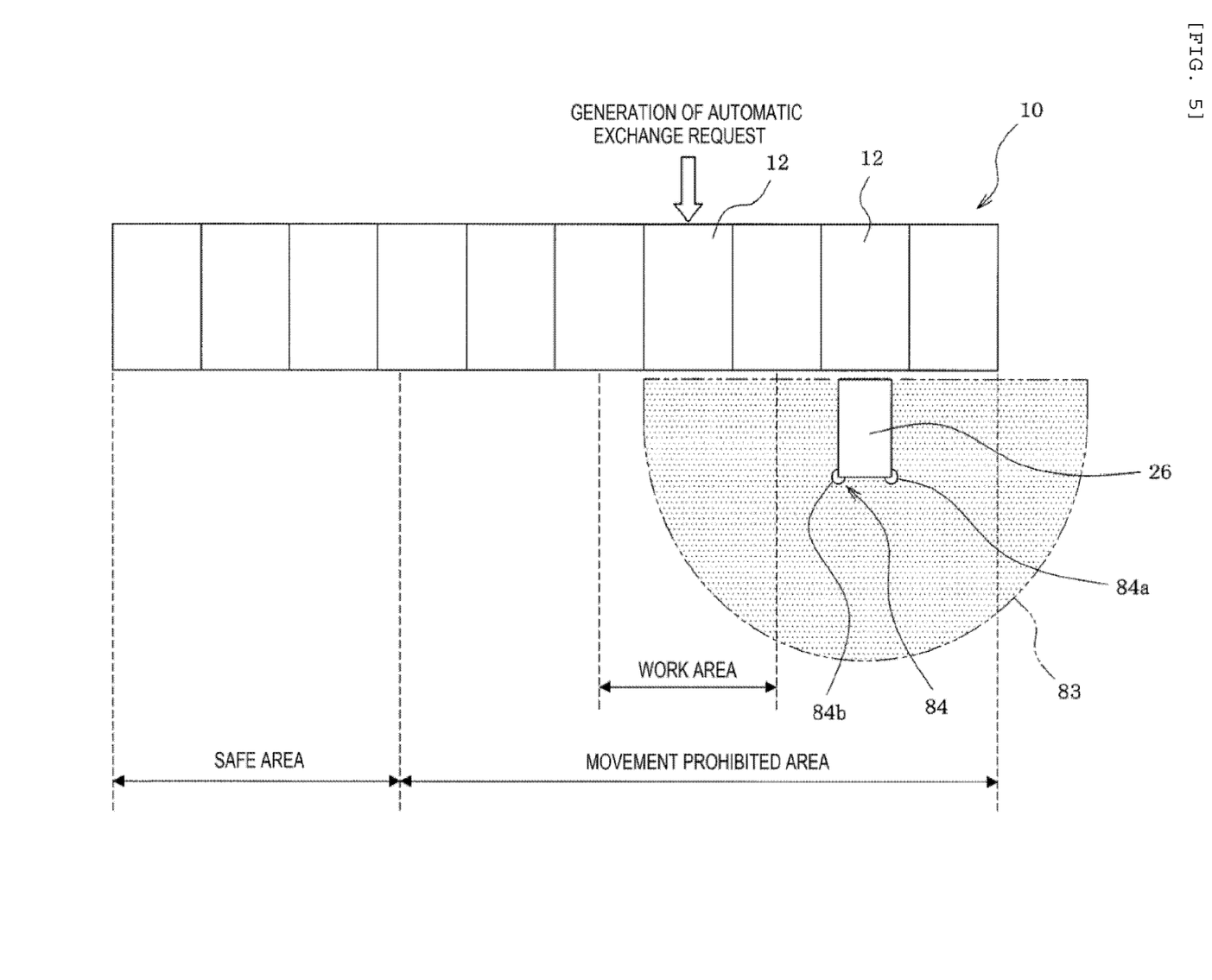
FIG. 5 is a plan view of the component mounting line showing a second example of a positional relationship among the position of a component mounting machine in which an error has occurred, a work area, a monitoring area, a movement prohibited area, and a safe area.
Figure 6:
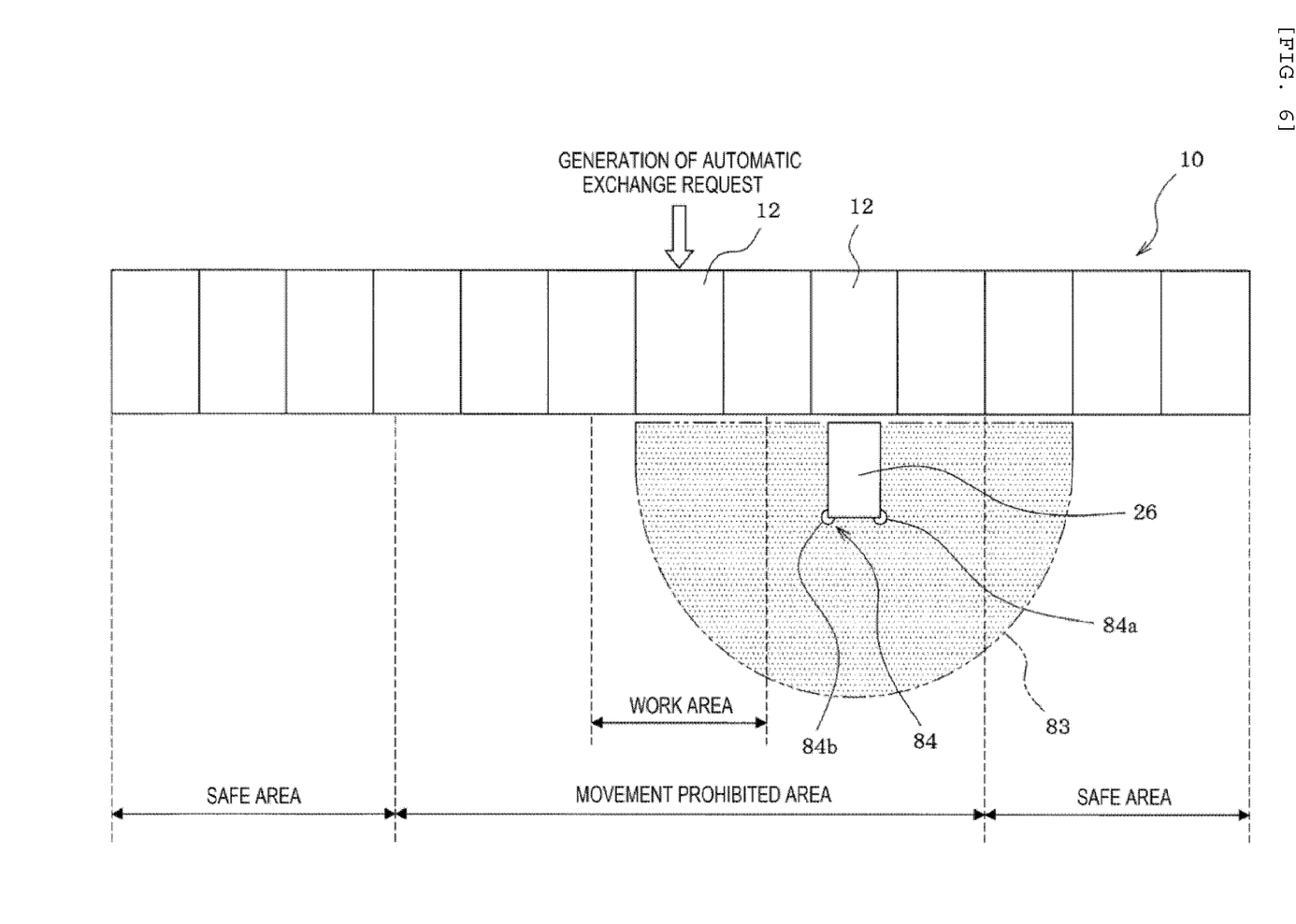
FIG. 6 is a plan view of the component mounting line showing a third example of a positional relationship among the position of a component mounting machine in which an error has occurred, a work area, a monitoring area, a movement prohibited area, and a safe area.

Therefore, in the present embodiment, production management computer 70 works in conjunction with control device 20 of multiple component mounting machines 12 constituting component mounting line 10 to monitor the operational state of each component mounting machine 12, and until it is determined that the work is completed when an error requiring work of an operator occurs in any one of component mounting machines 12, as shown in FIGS. 4 to 6, a predetermined range including component mounting machine 12 is set as a movement prohibited area of automatic exchanging device 26, and automatic exchanging device 26 is evacuated to a safe area which is an area outside the movement prohibited area. Determination of work completion may be made, for example, based on the output signals of the various sensors provided in component mounting machine 12, or the operator may input a work completion signal (i.e., a production restart signal) by operating input device 21 of component mounting machine 12, the portable terminal, or the like when the work is completed.

Unlike the present embodiment, when monitoring unit 84 for monitoring the intrusion of a person or an object into monitoring area 83 around automatic exchanging device 26 is not provided, the movement prohibited area of automatic exchanging device 26 may be set to the same area as the work area necessary for the operator to perform the work on component mounting machine 12 in which the error requiring an operator's work has occurred. By doing so, it is possible to prevent automatic exchanging device 26 from interfering when the operator performs work on component mounting machine 12 in which an error has occurred, making it possible to efficiently perform work on component mounting machine 26 in which the error occurred.

On the other hand, in the case where monitoring unit 84 is provided as in the present embodiment, if the movement prohibited area of automatic exchanging device 26 is set to only the work area, when automatic exchanging device 26 is located near the work area, the operator working in the work area enters monitoring area 83 of monitoring unit 84, the power supply to automatic exchanging device 26 is shut off, and an emergency stop is applied to automatic exchanging device 26.

Therefore, in the present embodiment, as shown in FIGS. 4 to 6, the movement prohibited area of automatic switching device 26, not only the work area but all areas in which at least a portion of monitoring area 83 of monitoring unit 84 overlaps the work area is set as a movement prohibited area of automatic exchanging device 26, monitoring area 83 of monitoring unit 84 being a monitoring area which moves together with automatic exchanging device 26. In this manner, since the movement prohibited area of automatic exchanging device 26 includes not only the work area but also an area in which at least a portion of monitoring area 83 of monitoring unit 84 overlaps with the work area, it is possible to prevent beforehand the operator, working in the work area on component mounting machine 12 in which an error has occurred, from entering monitoring area 83 of monitoring unit 84 and prevent automatic exchanging device 26 from being stopped in an emergency due to the power supply to automatic exchanging device 26 being shut off while the operator is working.

Production management computer 70 moves automatic exchanging device 26 to the front of component mounting machine 12 to perform automatic exchange of feeder 14 when an automatic exchange request of feeder 14 is generated in any of component mounting machines 12 located in the safe area during the period in which automatic exchanging device 26 is evacuated to the safe area. In this manner, even when automatic exchanging device 26 is evacuated to the safe area, feeder 14 of component mounting machine 12 located within the safe area can be automatically exchanged in response to the automatic exchange request.

Figure 7:
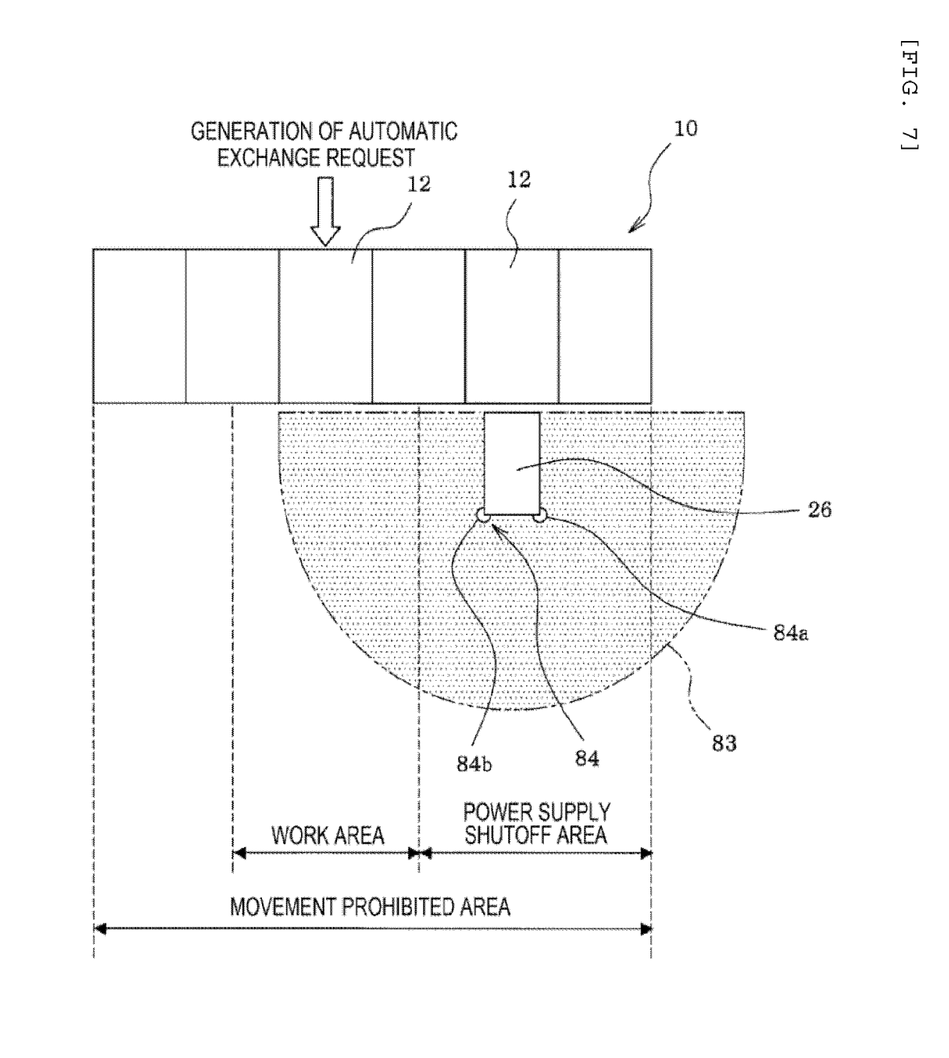
FIG. 7 is a plan view of a component mounting line showing a fourth example of a positional relationship among the position of a component mounting machine in which an error has occurred, a work area, a monitoring area, a movement prohibited area, and a power supply shutoff area.

Incidentally, as shown in FIG. 7, when the number of component mounting machines 12 constituting component mounting line 10 is small and the length of component mounting line 10 is short, depending on the position of component mounting machine 12 in which an error has occurred, the entire component mounting line 10 becomes a movement prohibited area, and there may be no remaining area for evacuating automatic exchanging device 26 out of the movement prohibited area. In this case, automatic exchanging device 26 may be evacuated to a power supply shutoff area, which is an area outside the work area, to shut off the power supply to automatic exchanging device 26. In this manner, when automated exchange device 26 is in the work area of component mounting machine 12 in which an error has occurred, the power supply to automatic exchanging device 26 can be shut off after automatic exchanging device 26 is extracted to the power supply shutoff area outside the work area, and an emergency stop of automatic exchanging device 26 in the work area due to shutting off the power supply can be prevented. As a result, as shown in FIG. 7, even when there is no safe area, automatic exchanging device 26 does not interfere with the operator's work on component mounting machine 12 in which an error has occurred, and the work on component mounting machine 12 in which the error has occurred can be performed efficiently.

When automatic exchanging device 26 is evacuated from the work area to the power supply shutoff area, automatic exchanging device 26 may be stopped at any position within the power supply shutoff area, and therefore, the evacuated position of automatic exchanging device 26 may be determined within power supply shutoff area so that the moving distance of automatic exchanging device 26 becomes shorter. When automatic exchanging device 26 is positioned within the power supply shutoff area when an error occurs in component mounting machine 12, the power supply may be shut off as is without moving automatic exchanging device 26.

When shutting off the power supply to automatic exchanging device 26 in the power supply shutoff area, production management computer 70 and/or control device 20 of each component mounting machine 12 maintains the control power supply that is the power supply to the control system of monitoring unit 84 and automatic exchanging device 26 even during the shutoff of the power supply, and monitoring unit 84 monitors whether a person or an object has intruded into monitoring area 83; and when it is detected that a person or an object that has intruded into monitoring area 83 has come out of monitoring area 83 and it is determined that work on component mounting machine 12 in which an error has occurred has been completed, the power supply to automatic exchanging device 26 is restored to restart movement control of automatic exchanging device 26.

Further, as shown in FIG. 6, in the case where there is a safe area in which automatic exchanging device 26 can be evacuated on both sides with the movement prohibited area interposed therebetween, automatic exchanging device 26 may be evacuated to the safe area in which the moving distance of automatic exchanging device 26 is shorter, or automatic exchanging device 26 may be evacuated to the safe area in which the number of component mounting machines 12 in the safe area is larger. The former has an advantage that the moving time at the time of evacuating automatic exchanging device 26 can be shortened, and the latter has an advantage that the number of component mounting machines 12 capable of automatically exchanging feeder 14 while automatic exchanging device 26 is evacuated can be increased.

Further, in the present embodiment, production management computer 70 and/or control device 20 of each component mounting machine 12 are equipped with a function of manually setting whether to perform the evacuation operation of automatic exchanging device 26 depending on the type of error of component mounting machine 12. In this manner, the operator can arbitrarily set the type of error to be subjected to the evacuation operation of automatic exchanging device 26.

With the present embodiment described above, when an error requiring an operator's work occurs in any of multiple component mounting machines 12 constituting component mounting line 10, a predetermined range including component mounting machine 12 is set as the movement prohibited area of automatic exchanging device 26 until completion of the work is determined, which evacuates automatic exchanging device 26 to the safe area from the movement prohibited area, thereby preventing automatic exchanging device 26 from becoming an obstacle when the operator performs the work on component mounting machine 12 in which the error has occurred, and the work on component mounting machine 12, in which the error has occurred, can be performed efficiently.

It is needless to say that the present disclosure is not limited to the above-described embodiment, and can be implemented by various changes within a range not departing from the gist, such as changing the configuration of component mounting line 10, changing the configuration of each component mounting machine 12, and changing the configuration of automatic exchanging device 26.

REFERENCE SIGNS LIST

10 . . . Component mounting line,
11 . . . Circuit board,
12 . . . Component mounting machine,
14 . . . Cassette-type feeder,
15 . . . Mounting head,
20 . . . Control device of component mounting machine,
21 . . . Input device,
23 . . . Display device,
24 . . . Feeder setting base,
26 . . . Automatic exchanging device, 70 . . . Production management computer (control device),
83 . . . Monitoring area,
84 . . . Monitoring unit,
84*a*, 84*b* . . . Reflective safety sensor,
90 . . . Control device of automatic exchanging device

The invention claimed is:

1. A component mounting line, in which multiple component mounting machines are arranged along a conveyance path of a circuit board and components supplied from a feeder setting base of each component mounting machine are mounted on the circuit board by the multiple component mounting machines, the component mounting line comprising:
   an automatic exchanging device configured to move alongside a front face of the component mounting line in an arrangement direction of the multiple component mounting machines to set and/or remove feeders of the feeder setting base of each component mounting machine, and
   a control device configured to control movement of the automatic exchanging device, wherein the control device monitors an operational state of the multiple component mounting machines, and when an error requiring an operator's work occurs in any of the component mounting machines, the control device sets a predetermined range including the component mounting machine as a movement prohibited area of the automatic exchanging device, and causes the automatic exchanging device move outside of the movement prohibited area until completion of the work is determined.

2. The component mounting line of claim 1, wherein the movement prohibited area of the automatic exchanging device is set to an area including a work area necessary for the operator to perform work on the component mounting machine in which the error requiring the operator's work has occurred.

3. The component mounting line of claim 2, wherein the automatic exchanging device is provided with a monitoring unit configured to monitor whether a person or an object has intruded into a monitoring area around the automatic exchanging device, the control device shuts off a power supply to a drive system of the automatic exchanging device when the monitoring unit detects an intrusion of the person or an object into the monitoring area, and the movement prohibited area of the automatic exchanging device is set to an area in which at least a portion of the monitoring area of the monitoring unit that moves together with the automatic exchanging device overlaps with the work area.

4. The component mounting line of claim 3, wherein the control device evacuates the automatic exchanging device to the outside of the work area and shuts off the power supply to the drive system of the automatic exchanging device when no area for evacuating the automatic exchanging device to the outside of the movement prohibited area remains.

5. The component mounting line of claim 3, wherein the control device determines that the work of the operator is completed after the power supply to the drive system of the automatic exchanging device is shut off and returns the power supply to the drive system of the automatic exchanging device when the monitoring unit does not detect a person or an object in the monitoring area.

6. The component mounting line of claim 3, wherein the control device maintains the power supply to a control system of the automatic exchanging device while the power supply to the drive system of the automatic exchanging device is shut off.

7. The component mounting line of claim 1, wherein the control device evacuates the automatic exchanging device to a safe area having a shorter moving distance of the automatic exchanging device when a safe area in which the automatic exchanging device can evacuate to exists on both sides of the movement prohibited area.

8. The component mounting line of claim 1, wherein the control device evacuates the automatic exchanging device to a safe area having a larger number of component mounting machines when the safe area in which the automatic exchanging device can be evacuated to is on both sides of the movement prohibited area.

9. The component mounting line of claim 1, wherein the control device moves the automatic exchanging device to a front of the component mounting machine to set and/or remove a feeder when a request for setting and/or removing the feeder occurs in any component mounting machine located in a safe area while the automatic exchanging device is evacuated to the safe area outside the movement prohibited area.

10. The component mounting line of claim 1, wherein the operator manually sets whether to perform an evacuation operation of the automatic exchanging device depending on the type of the error.

* * * * *